United States Patent [19]
Holm et al.

[11] Patent Number: 5,663,581
[45] Date of Patent: Sep. 2, 1997

[54] IMPLANTED LED ARRAY AND METHOD OF FABRICATION

[75] Inventors: Paige Holm, Phoenix; Benjamin W. Gable, Chandler, both of Ariz.

[73] Assignee: Motorola, Schaumburg, Ill.

[21] Appl. No.: 513,259

[22] Filed: Aug. 10, 1995

Related U.S. Application Data

[62] Division of Ser. No. 240,055, May 9, 1994, Pat. No. 5,453,386.

[51] Int. Cl.$^6$ .................................................. H01L 33/00
[52] U.S. Cl. ........................ 257/93; 257/90; 257/88; 257/94
[58] Field of Search ............................. 257/90, 88, 93, 257/94

[56] References Cited

U.S. PATENT DOCUMENTS

| | | | |
|---|---|---|---|
| 4,275,403 | 6/1981 | Lebailly | 257/91 |
| 4,707,716 | 11/1987 | Daniele | 257/93 |

FOREIGN PATENT DOCUMENTS

| | | | |
|---|---|---|---|
| 62-243376 | 10/1987 | Japan | 257/93 |

*Primary Examiner*—Jerome Jackson
*Attorney, Agent, or Firm*—Eugene A. Parsons

[57] ABSTRACT

A method of fabricating an LED array including epitaxially and sequentially growing a conductive layer on a substrate, a first carrier confinement layer, an active layer, a second carrier confinement layer and a conductive cap. Selectively etching the cap to provide exposed surface areas defining row and column areas with a matrix of diodes positioned in rows and columns therebetween. Implanting a first impurity in the row areas to form vertical conductors extending through the second confinement, active and first confinement layers to provide surface contacts to each diode. Implanting a second impurity in the row and column areas through the second confinement and active layers to form an isolating resistive volume around each diode. Implanting a third impurity in the row areas through the second confinement, active, and first confinement layers and into the substrate to form an isolating resistive volume between each row of diodes.

15 Claims, 7 Drawing Sheets

5,663,581

1

IMPLANTED LED ARRAY AND METHOD OF FABRICATION

This is a division of application Ser. No. 08/240,055, filed May 9, 1994 now U.S. Pat. No. 5,453,386.

FIELD OF THE INVENTION

The present invention pertains to light emitting diode arrays and more specifically to new and novel light emitting diode arrays and new and novel methods of fabricating light emitting diode arrays.

BACKGROUND OF THE INVENTION

Light emitting diodes (LEDs) are useful in various displays and especially in a new compact virtual display which utilizes an array of LEDs as an image source. The image source consists of a high pixel count (240 columns by 144 rows for a total of 34,560 pixels) 2-dimensional array of LEDs. The array of LEDs is used to form complete images containing pictorial (graphic) and/or alphanumeric characters. The complete images are then magnified to produce virtual images which appear to an operator to be at least the size of a standard sheet of paper.

In a copending application entitled "Electro-optic Integrated Circuit and Method of Fabrication", filed of even date herewith, and assigned to the same assignee, a method of fabricating LED arrays is disclosed utilizing mesa etched processing technology. A combination of wet and dry semiconductor etching is used for defining pixel emitting regions (anode isolation), accessing a highly conductive buried semiconductor layer for cathode contacting, and for isolating rows of pixels (cathode isolation).

One problem faced in productizing the etched mesa LED arrays, at the present time, is the nonplanarity of the resulting structures. Efficient opto-electronic light emitters require relatively thick layers of epitaxial material grown on a substrate. Because of the relatively thick layers of epitaxially grown material, the mesa etching produces nonplanarities which tend to be on the order of 1 micron or greater. Such large nonplanarities can lead to problems with resolute photolithography, uniform dielectric coverage, metal step coverage, or metal column and row connectors.

Accordingly, it is highly desirable to provide methods of fabricating LED arrays which overcome these problems.

It is a purpose of the present invention to provide a new and improved method of fabricating LED arrays.

It is a further purpose of the present invention to provide a new and improved LED array.

It is still a further purpose of the present invention to provide a new and improved method of fabricating LED arrays which is simpler and more efficient than prior methods and which is easily adaptable to high production levels.

It is another purpose of the present invention to provide a new and improved method of fabricating LED arrays which provides substantially planar semiconductor chips.

SUMMARY OF THE INVENTION

The above problems and others are substantially solved and the above purposes and others are realized in a method of fabricating an implanted light emitting diode array including the steps of providing a substrate of non-conductive material with a major surface, epitaxially growing a conductive layer of material on the major surface of the substrate, a first carrier confinement layer on the conductive layer, an active layer on the first carrier confinement layer, and a second carrier confinement layer on the active layer. Row areas and column areas with a matrix of diode light emitting areas positioned in rows and columns therebetween are defined on the second carrier confinement layer. A first impurity is implanted in a plurality of positions in the row areas to form a plurality of vertical conductors through the second carrier confinement layer, the active layer and at least partially through the first carrier confinement layer to provide row surface contacts to each diode in the matrix. A second impurity is implanted in the row and column areas through the second carrier confinement layer and at least through the active layer to form an isolating resistive volume around each diode light emitting area. The isolating resistive volume around each diode is further positioned to separate the vertical conductors from the active layer and the first carrier confinement layer. A third impurity is implanted in the row areas through the second carrier confinement layer, the active layer, the first carrier confinement layer and at least into the substrate to form an isolating resistive volume between each row of diode light emitting areas.

The above problems and others are substantially solved and the above purposes and others are further realized in an implanted light emitting diode array including a substrate of non-conductive material with a major surface having a conductive layer of material on the major surface thereof, a first carrier confinement layer on the conductive layer, an active layer on the first carrier confinement layer, and a second carrier confinement layer on the active layer. Row areas and column areas with a matrix of diode light emitting areas positioned in rows and columns therebetween is defined on the second carrier confinement layer. A first impurity residing in a plurality of positions in the exposed row areas forming a plurality of vertical conductors through the second carrier confinement layer, the active layer and at least partially through the first carrier confinement layer provides row surface contacts to each diode in the matrix. A second impurity residing in the exposed row and column areas and extending through the second carrier confinement layer and at least through the active layer forms a first isolating resistive volume around each diode light emitting area. The first isolating resistive volume around each diode is further positioned to separate the vertical conductors from the active layer and the first carrier confinement layer. A third impurity residing in the exposed row areas and extending through the second carrier confinement layer, the active layer, the first carrier confinement layer and at least into the substrate forms a second isolating resistive volume between each row of diode light emitting areas.

BRIEF DESCRIPTION OF THE DRAWINGS

Referring to the drawings wherein like characters indicate like parts throughout the various figures.

DESCRIPTION OF THE PREFERRED EMBODIMENT

Figure 1:
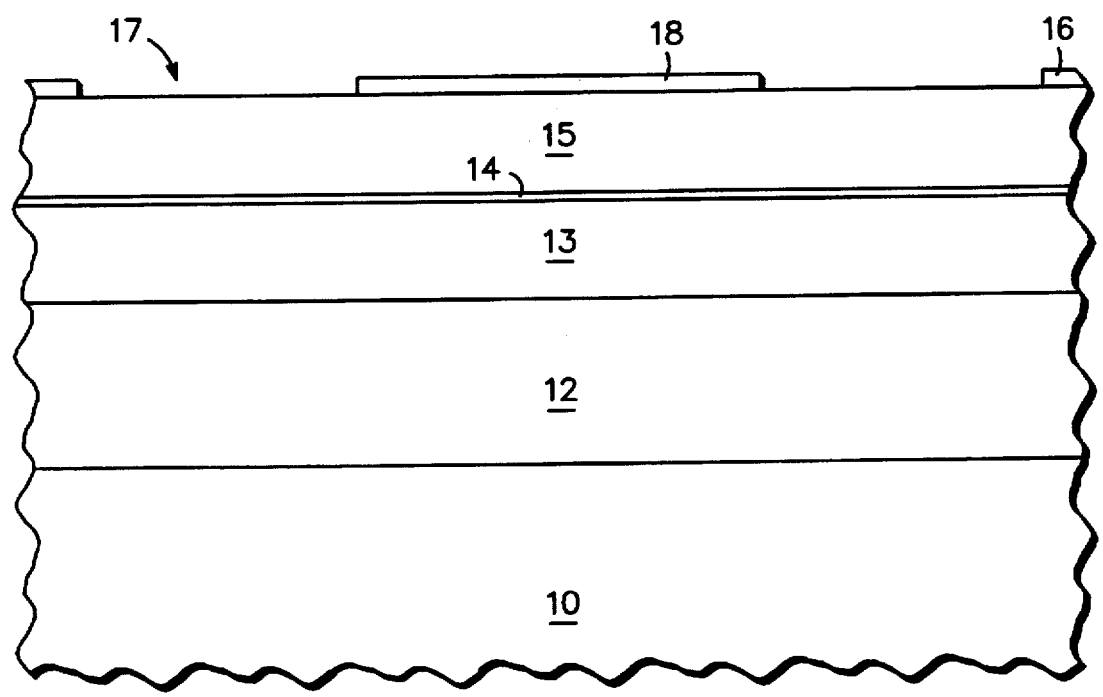
FIGS. 1–5 are simplified cross-sectional views illustrating sequential steps in the fabrication of an implanted light emitting diode array in accordance with the present invention.

A simplified cross-sectional view of an intermediate structure realized in the fabrication of an implanted light emitting diode array in accordance with the present invention is illustrated in FIG. 1. The structure includes a substrate 10 having a heavily doped conductive layer 12 formed thereon. A first carrier confinement layer 13, an active layer 14 and a second carrier confinement layer 15 are formed on conductive layer 12 using any known method. Carrier confinement layer 13, active layer 14 and carrier confinement layer 15 are the materials which are eventually separated into a plurality of light emitting diodes. A conductive cap layer 16 is formed on second confinement layer 15. Conductive layer 12 and cap layer 16 provide electrical contacts to opposite sides of the light emitting diodes.

In a specific example, substrate 10 is formed of undoped gallium arsenide (GaAs) to form a semi-insulating semiconductor. Conductive layer 12 is a relatively heavily doped layer of GaAs epitaxially grown on the surface of substrate 10. Carrier confinement layer 13 is an epitaxially grown layer of indium-gallium-aluminum-phosphide (InGaAlP) doped to provide N-type semiconductivity. Active layer 14 is an epitaxially grown layer of InGaAlP formed in a manner well known in the art so that further description is believed to be unnecessary. Carrier confinement layer 15 is an epitaxially grown layer of InGaAlP doped to provide P-type semiconductivity. Cap layer 16 is an epitaxially grown layer of GaAs heavily doped to provide P-type conductivity. It will of course be understood that the various layers can be provided in many other forms and the present embodiment is disclosed because of the simplicity of formation. Also, in some embodiments additional layers are provided for various special applications and it should be understood that the disclosed structure is intended as a basic structure for purposes of this disclosure and not as a limitation.

Cap layer 16 is selectively formed on carrier confinement layer 15 by any of several well known methods. For example, cap layer 16 is epitaxially grown as a blanket layer and areas 17 are removed by some convenient method such as etching to expose the surface of carrier confinement layer 15. In the present embodiment, cap layer 16 is epitaxially grown as a blanket layer and areas 17 are removed by etching, utilizing a mask (not shown) which mask is subsequently also utilized for implanting, as will be apparent presently. The exposed areas of carrier confinement layer 15 define exposed row areas and exposed column areas so as to divide the remaining portions of cap layer 16 into a matrix of diode light emitting areas 18. Throughout this description references to rows and columns are made for simplicity of the disclosure but it will be understood by those skilled in the art that these terms are completely interchangeable since rows and columns of a matrix generally depend upon a physical orientation. Reference to the top plan view of FIG. 6 during this description will aid in an understanding of the structure. It will of course be understood that cap layer 16 could also be selectively grown or deposited by masking the surface of carrier confinement layer 15. In either method, the cap layer does not significantly alter the planarity of the process since it is only on the order of 500 angstroms thick.

Figure 2:
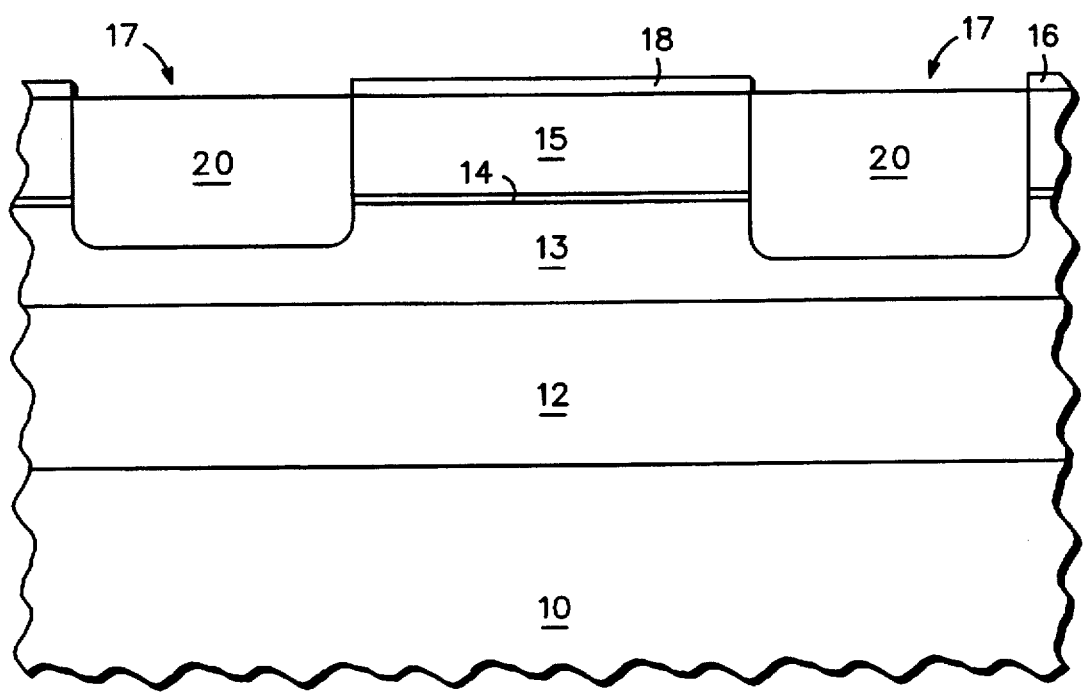

Referring to FIG. 2, a plurality of surface contacts to conductive layer 12 are formed by converting a vertical pillar 20 of P-type semiconductive material in carrier confinement layer 15 and the material of active layer 14 to heavily doped N-type conductive material. The conversion is accomplished by implanting an impurity in the exposed row areas 17 at the predetermined positions of vertical pillars 20. In this embodiment the surface contacts are formed in rows and a surface contact is provided for each light emitting diode in each row, to reduce the resistance of the connections to the lower contact of each light emitting diode. It should be understood, however, that some or all of the intermediate vertical pillars could be eliminated and row connections could be made by connections (vertical pillars 20) to conductive layer 12 at predetermined positions in each row or, for example, only at the ends of each row.

In a specific example, vertical pillars 20 are formed by using standard ion implant and implanting mask technology. Donor ions of silicon, Si+, are used but it will be understood that any known donor in this material system (e.g. Se, Te, etc.) could be utilized. Typically, manufacturing fabs are equipped with ion implanters having maximum accelerating voltages of 200 KeV. The projected range of doubly ionized Si ions at this energy is about 0.35 microns which limits the combined thickness of layers 15 and 14 to approximately 0.35 microns. It is, therefore, advantageous to remove the overlying portions (17) of cap layer 16 prior to the implanting step to maximize the implant depth. The implant dose must be sufficient to convert pillars 20 down through layers 15 and 14 to a conductor. To accomplish the conversion, the implant dose, in one embodiment, is in the range of $10^{14}$ per $cm^2$. A photoresist layer approximately 2.5 microns thick, formed into an implant mask in the usual manner, is sufficient to restrict the implant to vertical pillars 20.

Once the implant of vertical pillars 20 has been completed, the implant is activated with a high temperature anneal. Generally, because of the depth and dosage of the implant, the high temperature anneal requires a temperature in the range of approximately 800° C. to 900° C. The implant of vertical pillars 20 is generally a first step in the process sequence, because subsequent implant and metallization steps (to be explained) generally cannot tolerate this high temperature.

Figure 3:
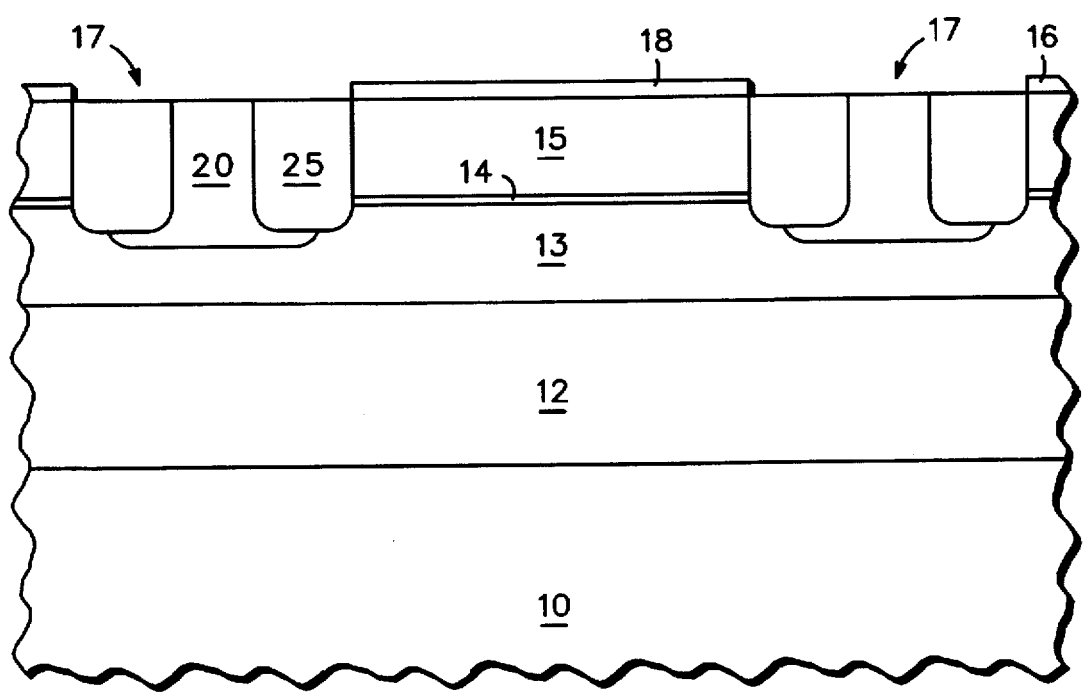

Referring to FIG. 3, confinement of each light emitting diode is achieved by implanting impurity material to form an isolating resistive volume, or moat 25, around each of the defined light emitting areas 18. Resistive moat 25 laterally confines current flow across the P-N junction (carrier confinement layer 15, active layer 14 and carrier confinement layer 13) of each of the light emitting diodes and, therefore, defines the emitting region of each of the light emitting diodes. The depth of moat 25 ranges from zero depth, in which only cap layer 16 is etched, to well into carrier confinement layer 13, depending upon the desired level of current confinement and the potential negative effects resulting from implanting through the P-N junction of the light emitting diodes (e.g. reliability issues). Corresponding implant energies range from 0 to approximately 200 KeV.

In a specific example, oxygen ions, O+, are utilized as the implanted impurity. It will be understood, however, that many other species including hydrogen (H+), boron (B+), etc. are known to produce resistive regions also. The implant dosage required for adequate isolation varies with the selected implant depth, but is typically in the range of $10^{12}$ to $10^{13}$ per $cm^2$. Generally, a photoresist layer approximately 2.0 microns thick, formed into an implant mask in the usual manner, is sufficient to restrict the implant to moat 25 surrounding each light emitting area 18. It should be understood that cap layer 16 is generally removed to form exposed areas 17 prior to this implant step because it is very difficult (there is no known implant process at this time) to make cap layer 16 highly resistive. As explained above, removal of cap layer 16 does not significantly effect the planarity of the structure because it is only approximately 500 angstroms thick. It should be noted that resistive moat 25 also acts to eliminate any parasitic, implanted P-N junctions at the interface between each light emitting diode (P-type carrier confinement layer 15) and N-type vertical pillars 20.

In the present embodiment, the exposed row areas and exposed column areas define a matrix of diode light emitting areas 18, which may, for example, contain as many as 200 or 300 columns and 100 or 200 rows of light emitting diodes, or in some special applications even more. Also, in the described embodiment described embodiment carrier confinement layer 13 and conductive layer 12 are common to each light emitting diode. This allows the lower terminals (carrier confinement layer 13) of each of the light emitting diodes in each row to be conveniently connected in common. However, in this embodiment it is necessary to isolate the rows of light emitting diodes from each other to prevent crosstalk therebetween.

Figure 4:
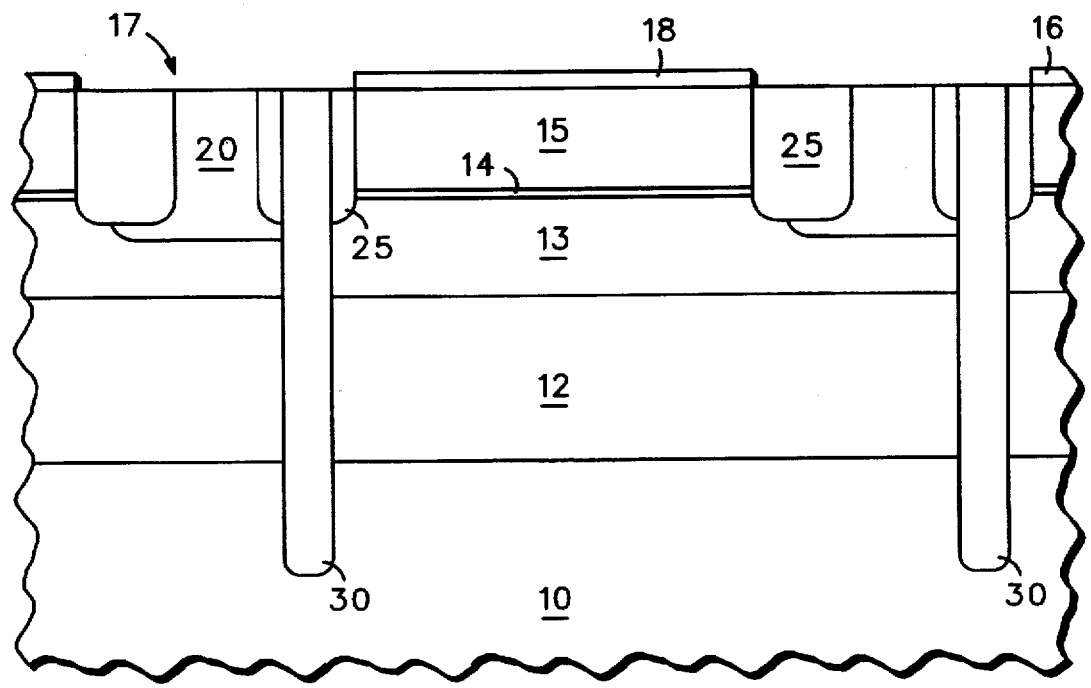

Referring to FIG. 4, in this specific embodiment the isolation is provided by an isolation implant 30 extending like a substantially continuous wall between each adjacent pair of rows of light emitting diodes. Further, implant 30 extends downwardly through carrier confinement layer 15, active layer 14, carrier confinement layer 13 and conductive layer 12 to electrically isolate adjacent rows from each other. In the specific embodiment illustrated in FIGS. 1-4, isolation implant 30 need only isolate the N-type layers (carrier confinement layer 13 and conductive layer 12) into rows, since resistive moat 25 isolates the P-type layers (carrier confinement layer 15 and active layer 14). In other embodiments, where resistive moat 25 is very thin vertically, it may be necessary that isolation implant 30 isolate P-type layers as well.

In a specific example, doubly ionized oxygen ions, O++, are used as the impurity because it allows a minimum implant mask thickness and oxygen implanted GaAs layers retain their resistive properties even after moderate temperature cycling. Since isolation implant 30 must extend through conductive layer 12, the depth range of isolation implant 30 limits the overall thickness (illustrated as "d" in FIG. 5) of the structure (layers 12, 13, 14 and 15). Doubly ionized oxygen ions have a projected range of about 0.6 microns at 200 KeV. Other ions, such as hydrogen (H+) or boron(B+) may provide greater isolation depths, thereby allowing greater structure thicknesses. Implant doses of approximately $10^{13}$ per $cm^2$ to $10^{14}$ per $cm^2$ have been found to be adequate for the required isolation. A photoresist mask about 3 microns thick is adequate for the isolation implant step.

Figure 5:
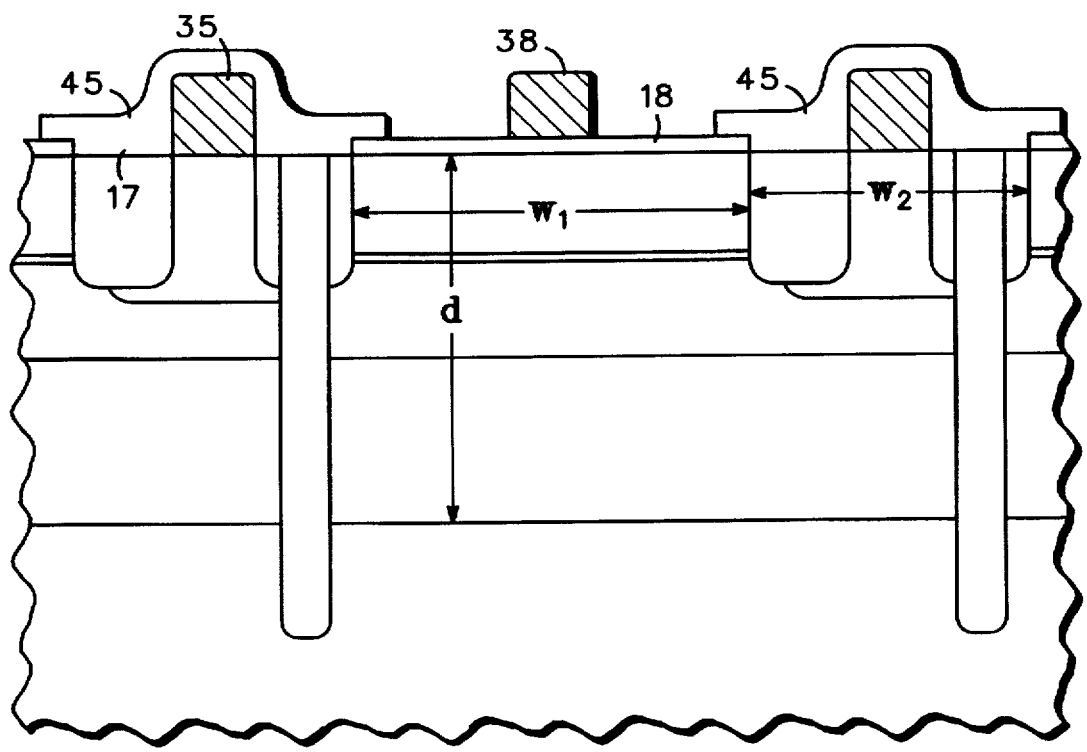
Figure 6:
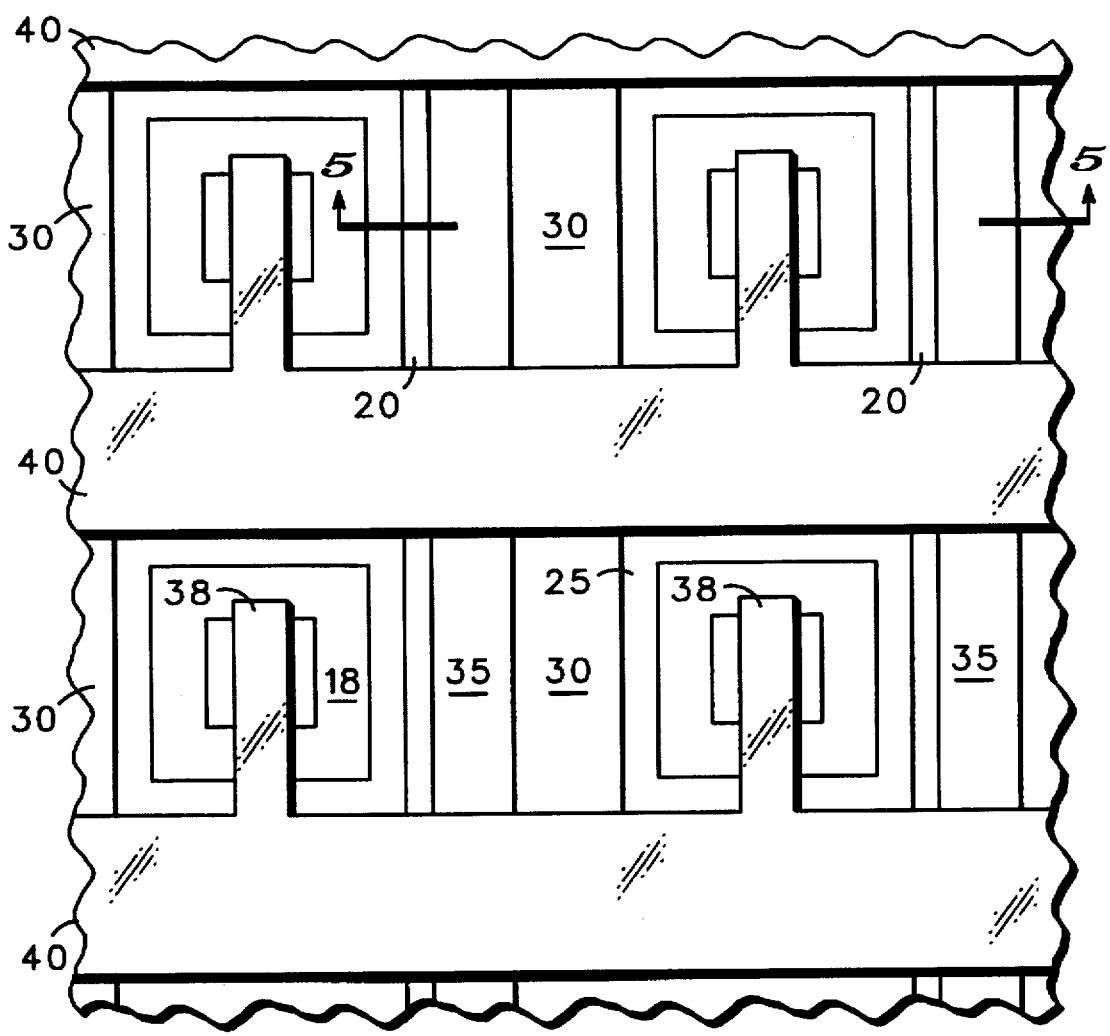
FIG. 6 is a view in top plan of an complete implanted light emitting diode array, portions thereof broken away.
Figure 7:
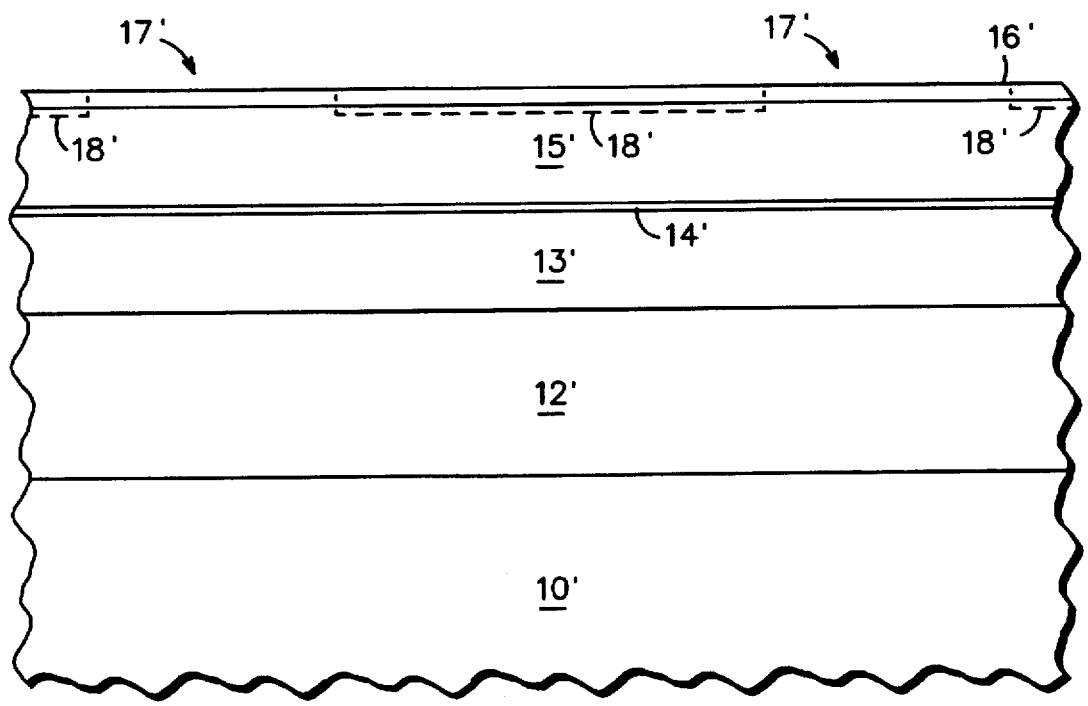
FIGS. 7–12 are simplified cross-sectional views illustrating sequential steps in another fabrication method in accordance with the present invention.

Referring to FIGS. 5 and 6, a complete light emitting diode array is illustrated. FIG. 6 is a top plan with portions thereof broken away and FIG. 5 is a sectional view generally as seen from the line 5—5 of FIG. 6. Once the structure of FIG. 4 is completed the remainder of the fabrication process includes forming N-type and P-type ohmic contacts to each light emitting diode, applying interlayer dielectric with contact vias and patterning interconnect metallization. Generally, these steps can be performed by standard silicon and GaAs integrated circuit fabrication processes. In this specific example, the plurality of surface contacts formed by conductive vertical pillars 20 are connected into rows by row busses 35. The row busses 35 are N-contact metal, for example NiGeAu liftoff approximately 4000 angstroms thick, applied with an appropriate photoresist pattern, and alloyed at a temperature of approximately 460° C. Thus, the lower terminal of each light emitting diode, which in this embodiment is the cathode, in each row is connected to the lower terminal of each other light emitting diode in the row and to an external connection pad (not shown).

Similarly, the upper terminal of each diode (light emitting area 18 of cap layer 16) in each column is connected by a connection 38 to a column bus 40 (see FIG. 6). Column busses 40 and connections 38 are P-contact metal, for example TiPtAu liftoff approximately 7000 angstroms thick, applied with an appropriate photoresist pattern, and alloyed at a temperature of approximately 250° C. Thus, the upper terminal of each light emitting diode in a column is connected to the upper terminal of each other light emitting diode in the column. A dielectric layer 45 of SiN/SiO is provided to electrically separate the metallization forming row busses 35 from connections 38 and column busses 40. As illustrated in FIG. 5, in the specific example, light emitting area 18 of each light emitting diode is approximately square with a dimension $W_1$ of approximately 10 microns. The row and column areas 17 between light emitting areas 18 of the light emitting diodes, both of which are approximately equal, have widths, $W_2$, which is less than approximately 10 microns. Thus, approximately 25% of the surface of the structure is light emitting.

Referring to FIGS. 7-12, various steps in a somewhat modified method of fabricating LED arrays are illustrated. In this embodiment, components similar to components of the above embodiment are designated with similar numerals and all of the numerals further include a prime to indicate that this is a different embodiment Referring specifically to FIG. 7, the structure, which is basically the same as the structure of FIG. 1, includes a substrate 10' having a heavily doped conductive layer 12' formed thereon. A first carrier confinement layer 13', an active layer 14' and a second carrier confinement layer 15' are formed on conductive layer 12' using any known method. Carrier confinement layer 13', active layer 14' and carrier confinement layer 15' are the materials which are eventually separated into a plurality of light emitting diodes. A conductive cap layer 16' is formed on second confinement layer 15'. One exception in this method of fabrication is that cap layer 16' is grown undoped. A first step is then to selectively implant a material, such as beryllium ions (Be+) to form p+ contact areas and to define diode light emitting areas 18'. Generally, the implant is relatively shallow (<50 KeV) with a dose in the range of approximately 1E14–1E15 $cm^2$ to heavily dope cap layer 16' for making good ohmic contacts and for lateral current spreading.

Figure 8:
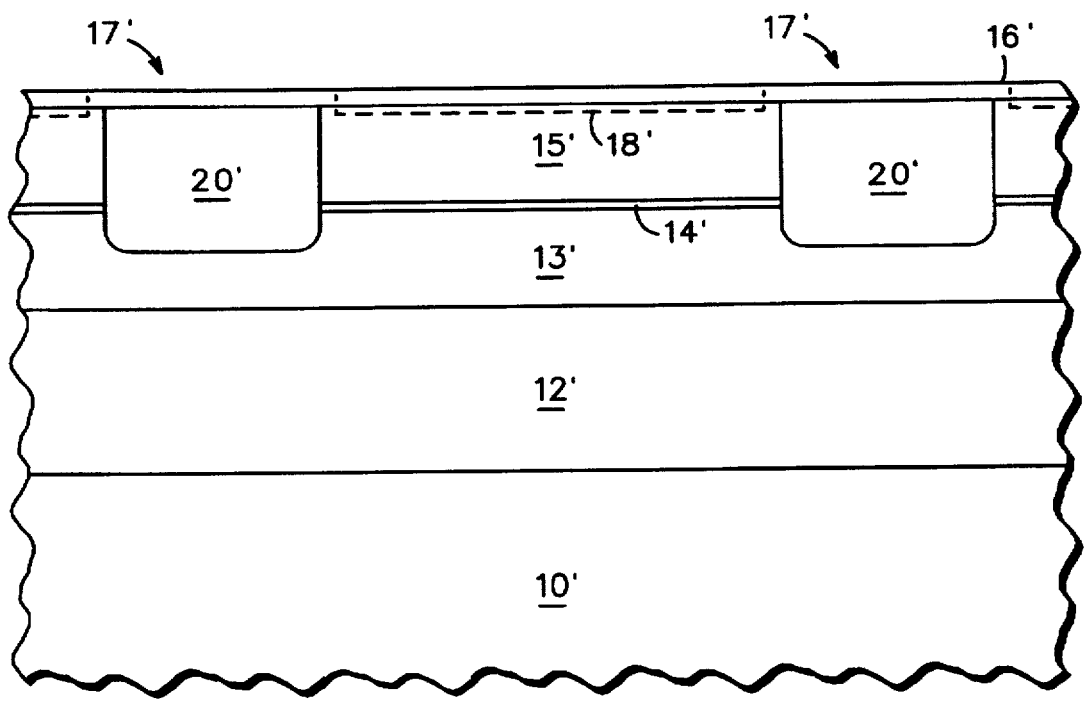

As in the previously described method, the next step, referring specifically to FIG. 8, is to implant Si+, or the like, to provide contact to n-type layers 12' and 13' below the junction. Both the Be+ implant and the Si+ implant can be coannealed at high temperatures (~850°–900° C.).The important difference in this fabrication process is that the Si+ implant dopes cap layer 16' so that it is n-type in regions 17' where the n-contacts will be made.

Figure 9:
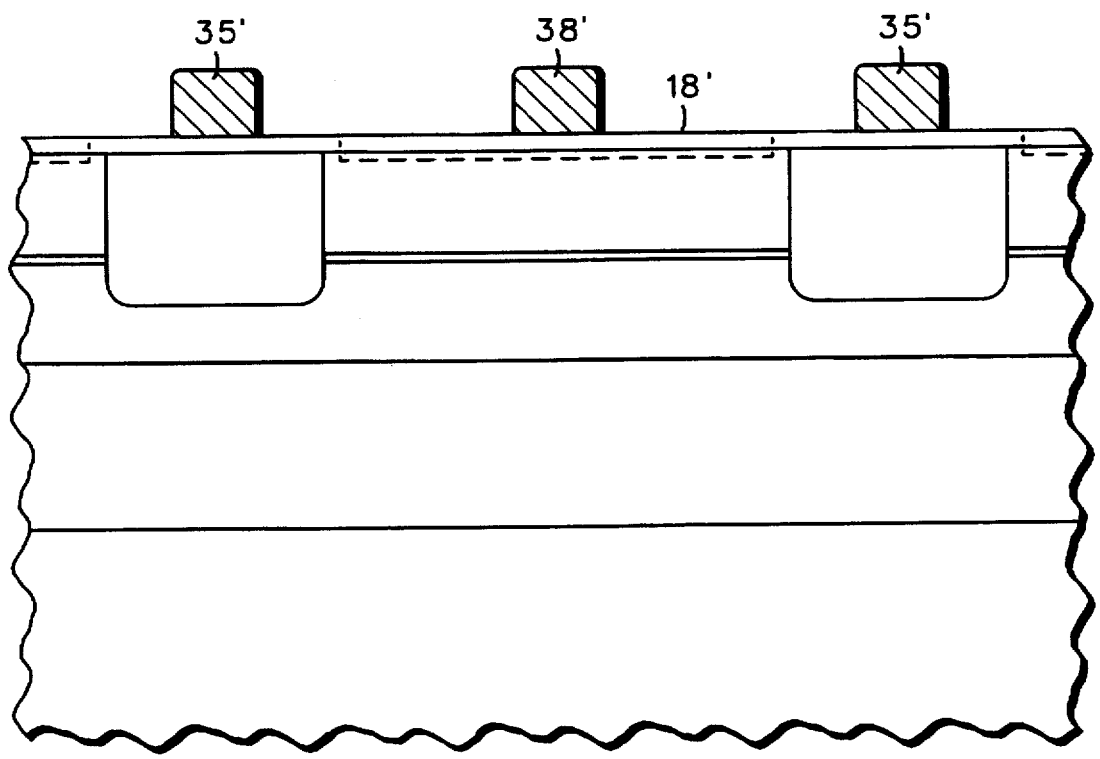

Ohmic metallization is then performed to form contacts 35' and 38', as illustrated in FIG. 9. In this specific embodiment, the same metallization (i.e. Ni/Ge/W) is used for both n-contacts 35' and p-contacts 38' in a standard liftoff process to pattern the metal, but it will be understood that other materials and methods may be utilized if desired. The metallization is then alloyed at about 550° C. A key difference in the present fabrication method is that n-contacts 35' are to GaAs cap layer 16' instead of a type-converted (p-type to n-type) InGaAlP layer 15', as in the previous process. This modified contact provides a much improved ohmic contact to the more heavily doped, lower band gap layer 12'.

Figure 10:
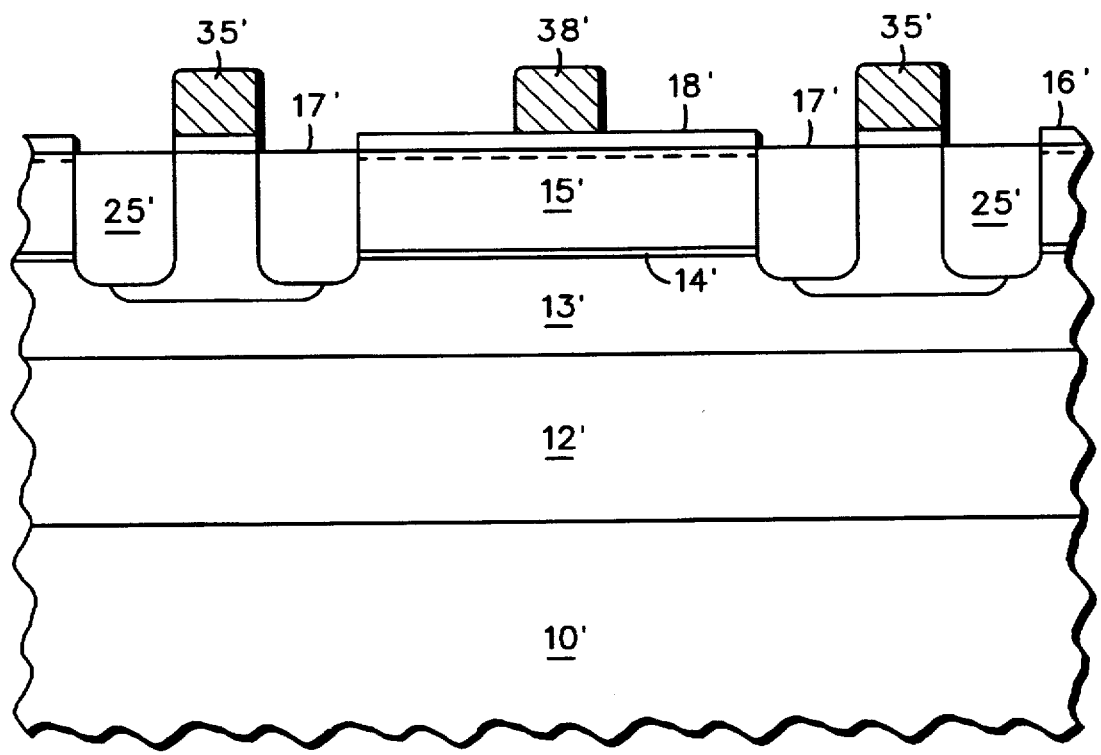

As in the previously explained fabrication method, confinement of each light emitting diode is achieved by implanting impurity material to form an isolating resistive volume, or moat 25'around each of the defined light emitting areas 18', as illustrated in FIG. 10. Resistive moat 25' laterally confines current flow across the P-N junction (carrier confinement layer 15', active layer 14' and carrier confinement layer 13') of each of the light emitting diodes and, therefore, defines the emitting region of each of the light emitting diodes. Also, cap layer 16' is etched away in regions 17' to eliminate the formation of a lateral parasitic p-n junction at the surface.

Figure 11:
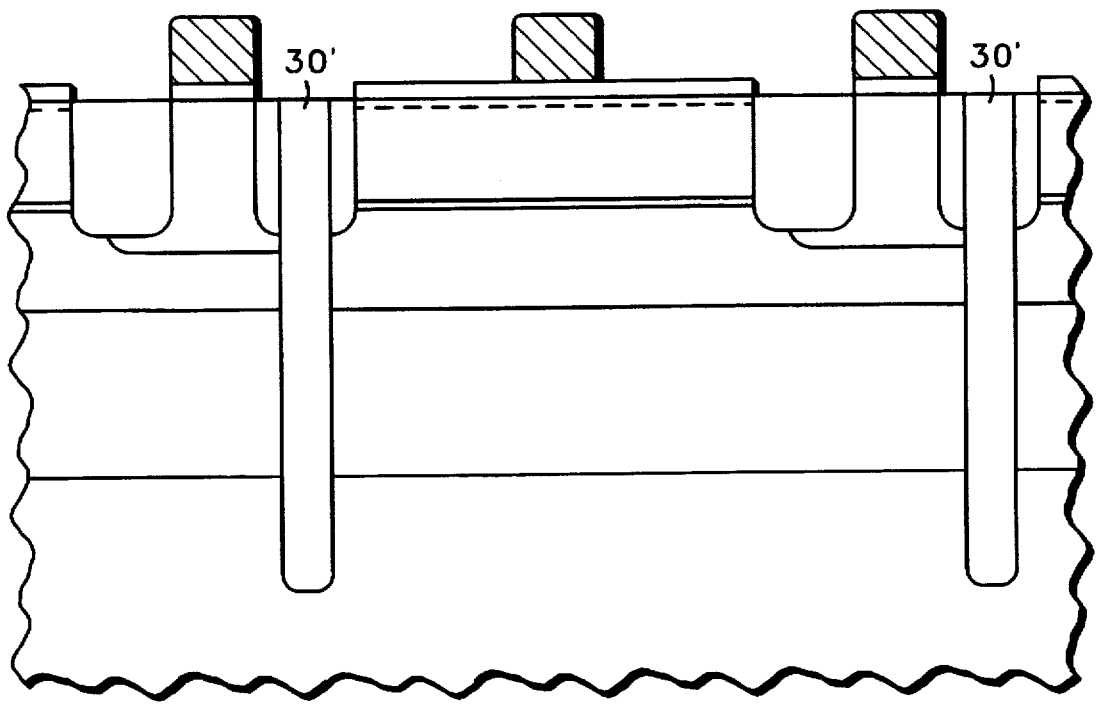
Figure 12:
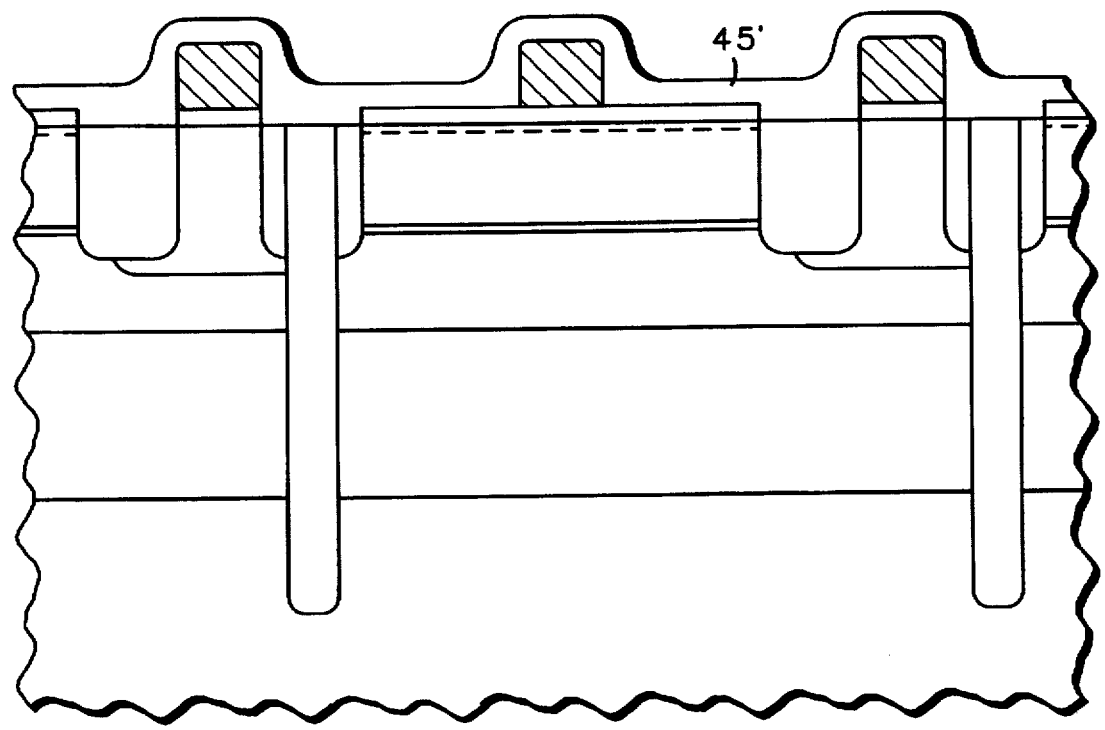

Row isolation is provided as in the previously explained fabrication method by an isolation implant 30' extending like a substantially continuous wall between each adjacent pair of rows of light emitting diodes, as illustrated in FIG. 11. Implant 30' extends downwardly through carrier confinement layer 15', active layer 14', carrier confinement layer 13' and conductive layer 12' to electrically isolate adjacent rows from each other, generally as previously described.

The final steps of the fabrication method include coating the structure with a layer 45' of dielectric material, such as $SiO_2$, etching vias to contact ohmic metallization contacts 35' and 38', and patterning interconnect metallization to connect the diodes into rows and columns. These final steps may generally be performed in any of a variety of ways known in the art.

Thus, at least two methods of fabricating LED arrays which overcome many of the prevalent problems are disclosed. The new and improved methods of fabricating LED arrays are simpler and more efficient than other methods and are easily adaptable to high production levels. Further, the new and improved methods of fabricating LED arrays provide substantially planar semiconductor chips which simplify many of the steps including metallization, forming insulating layers etc. Also, etching, which is generally a difficult process, is minimized.

The various steps of the methods disclosed have been performed in a specific order for purposes of explanation, however, it should be understood that various steps of the disclosed methods may be interchanged and/or combined with other steps in specific applications and it is fully intended that all such changes in the disclosed methods come within the scope of the claims.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. An implanted light emitting diode array comprising:
   a substrate of non-conductive material with a major surface;
   a conductive layer of material on the major surface of the substrate, a first carrier confinement layer on the conductive layer, an active layer on the first carrier confinement layer, and a second carrier confinement layer on the active layer;
   row areas and column areas with a matrix of diode light emitting areas positioned in rows and columns therebetween defined on the second carrier confinement layer;
   a first impurity residing in a plurality of positions in the exposed row areas forming a plurality of vertical conductors through the second carrier confinement layer, the active layer and at least partially through the first carrier confinement layer, the first impurity providing row surface contacts to each diode in the matrix;
   a second impurity residing in the exposed row and column areas and extending through the second carrier confinement layer and at least through the active layer to form an isolating resistive volume around each diode light emitting area, the isolating resistive volume around each diode being further positioned to separate the vertical conductors from the active layer and the first carrier confinement layer; and
   a third impurity residing in the exposed row areas and extending through the second carrier confinement layer, the active layer, the first carrier confinement layer and at least into the substrate to form an isolating resistive volume between each row of diode light emitting areas.

2. An implanted light emitting diode array comprising:
   a substrate of non-conductive material having a major surface;
   a conductive layer of material positioned on the major surface of the substrate;
   a first carrier confinement layer positioned on the conductive layer;
   an active layer positioned on the first carrier confinement layer;
   a second carrier confinement layer positioned on the active layer;
   a conductive cap layer positioned on the second carrier confinement layer, portions of the cap layer being removed to expose a surface of the second confinement layer defining exposed row areas and exposed column areas with a matrix of diode light emitting areas therebetween positioned in rows and columns;
   a first impurity residing in a plurality of positions in the exposed row areas forming a plurality of vertical conductors through the second carrier confinement layer, the active layer and at least partially through the first carrier confinement layer, the first impurity providing row surface contacts to each diode in the matrix;
   a second impurity residing in the exposed row and column areas and extending through the second carrier confinement layer and at least through the active layer to form an isolating resistive volume around each diode light emitting area, the isolating resistive volume around each diode being further positioned to separate the vertical conductors from the active layer and the first carrier confinement layer; and
   a third impurity residing in the exposed row areas and extending through the second carrier confinement layer, the active layer, the first carrier confinement layer and at least into the substrate to form an isolating resistive volume between each row of diode light emitting areas.

3. An implanted light emitting diode array as claimed in claim 2 wherein the substrate is formed of gallium arsenide.

4. An implanted light emitting diode array as claimed in claim 3 wherein the conductive layer of material includes gallium arsenide doped with an impurity to produce N-type conductivity.

5. An implanted light emitting diode array as claimed in claim 4 wherein the first carrier confinement layer is formed of indium-gallium-aluminum-phosphide doped with an impurity to produce N-type semiconductivity.

6. An implanted light emitting diode array as claimed in claim 5 wherein the active layer is formed of indium-gallium-aluminum-phosphide.

7. An implanted light emitting diode array as claimed in claim 6 wherein the second carrier confinement layer is formed of indium-gallium-aluminum-phosphide doped with an impurity to produce P-type semiconductivity.

8. An implanted light emitting diode array as claimed in claim 7 wherein the conductive cap layer of material includes gallium arsenide doped with an impurity to produce P-type conductivity.

9. An implanted light emitting diode array as claimed in claim 2 wherein the first impurity forming a plurality of vertical conductors has a vertical depth from the major surface of the substrate at least approximately 0.35 microns.

10. An implanted light emitting diode array as claimed in claim 9 wherein the first impurity includes Si+ donor ions.

11. An implanted light emitting diode array as claimed in claim 2 wherein the second impurity has a vertical depth from the major surface of the substrate at least approximately 500 angstroms.

12. An implanted light emitting diode array as claimed in claim 11 wherein the first impurity includes O+ oxygen ions.

13. An implanted light emitting diode array as claimed in claim 2 wherein the third impurity has a vertical depth from the major surface of the substrate at least approximately 0.6 microns.

14. An implanted light emitting diode array as claimed in claim 13 wherein the third impurity includes O+ oxygen ions.

15. An implanted light emitting diode array comprising:

a substrate of non-conductive material having a major surface;

a conductive layer of material positioned on the major surface of the substrate;

a first carrier confinement layer positioned on the conductive layer;

an active layer positioned on the first carrier confinement layer;

a second carrier confinement layer positioned on the active layer;

a cap layer positioned on the second carrier confinement layer, portions of the cap layer being selectively doped to form areas of a first conductivity type defining a matrix of diode light emitting areas between row areas and column areas;

a first impurity residing in a plurality of positions in the row areas forming a plurality of vertical conductors through the cap layer, the second carrier confinement layer, the active layer and at least partially through the first carrier confinement layer, the first impurity further doping row areas of the cap layer a second conductivity type to provide row surface contacts to each diode in the matrix;

electrical contacts on the cap layer in each diode light emitting area of the matrix and in contact with the row surface contacts of the cap layer;

the cap layer being selectively etched to prevent contact between areas of the first conductivity type and the second conductivity type;

a second impurity residing in the exposed row and column areas and extending through the second carrier confinement layer and at least through the active layer to form an isolating resistive volume around each diode light emitting area, the isolating resistive volume around each diode being further positioned to separate the vertical conductors from the active layer and the first carrier confinement layer; and a third impurity residing in the exposed row areas and extending through the second carrier confinement layer, the active layer, the first carrier confinement layer and at least into the substrate to form an isolating resistive volume between each row of diode light emitting areas.

* * * * *